United States Patent [19]
Chen et al.

[11] Patent Number: 5,917,332
[45] Date of Patent: Jun. 29, 1999

[54] ARRANGEMENT FOR IMPROVING DEFECT SCANNER SENSITIVITY AND SCANNING DEFECTS ON DIE OF A SEMICONDUCTOR WAFER

[75] Inventors: Ming Chun Chen, Milpitas; Yung-Tao Lin, Fremont, both of Calif.

[73] Assignee: Advanced Micro Devices, Inc., Sunnyvale, Calif.

[21] Appl. No.: 08/647,408

[22] Filed: May 9, 1996

[51] Int. Cl.$^6$ .......................... G01R 31/265; G06K 9/74
[52] U.S. Cl. .......................... 324/765; 438/14; 382/147; 382/149; 382/151
[58] Field of Search .................................... 324/765, 758; 29/829, 833, 846; 438/14, 16; 356/72, 399; 382/145, 147, 149, 151

[56] References Cited

U.S. PATENT DOCUMENTS

| | | | |
|---|---|---|---|
| 4,344,064 | 8/1982 | Bitler et al. | 338/334 |
| 4,357,100 | 11/1982 | Mayer et al. | 355/62 |
| 4,437,229 | 3/1984 | Bitler et al. | 29/593 |
| 4,965,515 | 10/1990 | Karasawa | 324/759 |
| 4,992,729 | 2/1991 | Nadeau | 324/765 |
| 5,545,570 | 8/1996 | Chung et al. | 382/151 X |
| 5,563,520 | 10/1996 | Terada | 324/754 |
| 5,656,402 | 8/1997 | Kasuga | 356/399 X |
| 5,825,913 | 10/1998 | Rostami et al. | 382/151 |

*Primary Examiner*—Glenn W. Brown

[57] ABSTRACT

Defect scanner sensitivity and accuracy are improved for light scattering defect scanners and pattern matching defect scanners by calibrating the defect scanners to each die on a wafer using preset marks on the corresponding die. The marks have a predetermined size based on the sensitivity of the defect scanners and a predetermined position relative to the circuit pattern on the corresponding die. Alignment of the defect scanners to a specific die provides improvement in coordinate accuracy over alignment with respect to an entire wafer. A layout mapping defect filtering system collects defect scan data and determines the interaction between the detected defects and a circuit layout. The layout mapping defect filtering system provides automatic identification in real time of killer defects that cause failure of the completed integrated circuit, and classifies and analyzes defects to identify potential killer defects within specified defect classes to identify defective die. The system provides accurate yield estimation to determine whether a produced wafer should be scrapped, and also provides accumulated data for yield improvement studies including quality control and circuit redesign.

28 Claims, 7 Drawing Sheets

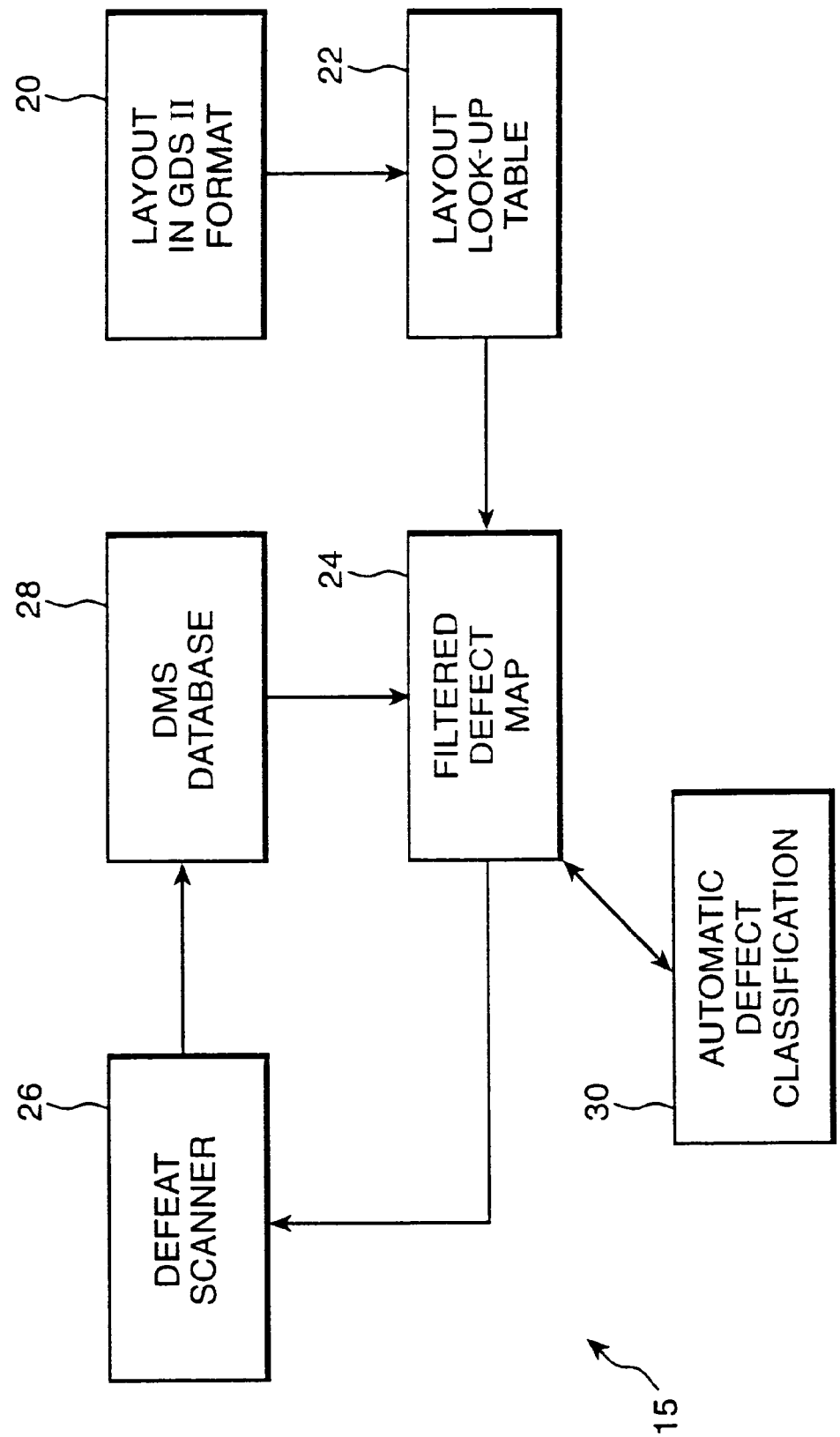

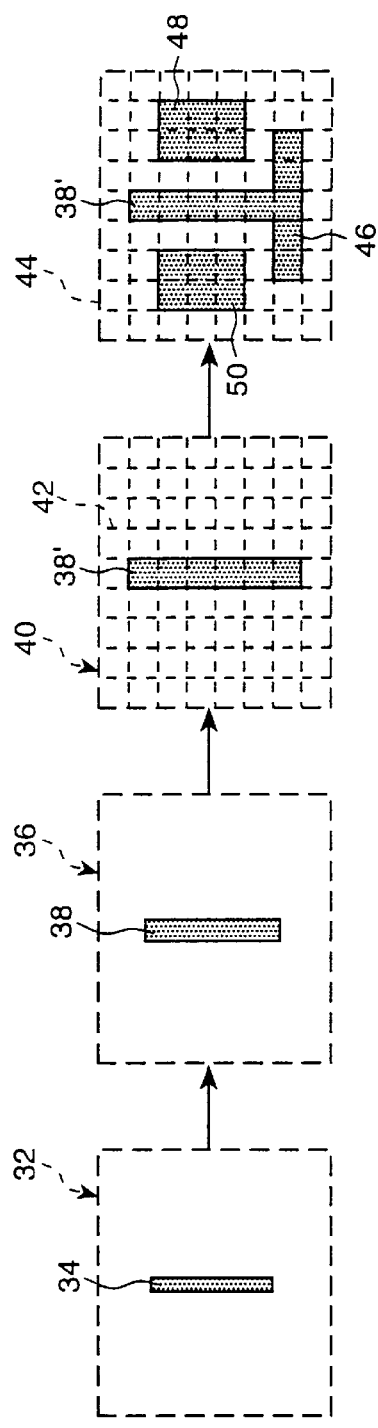
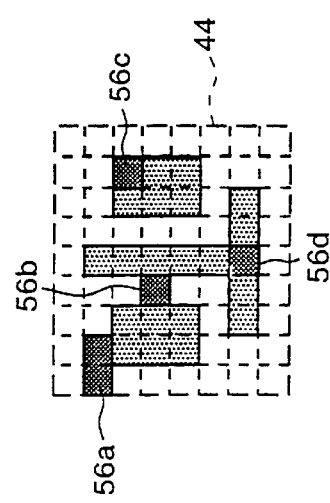
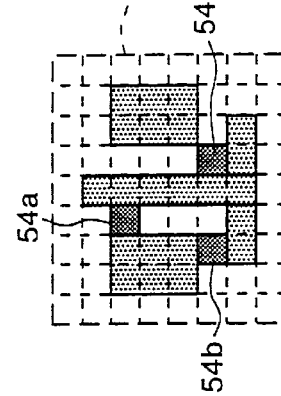
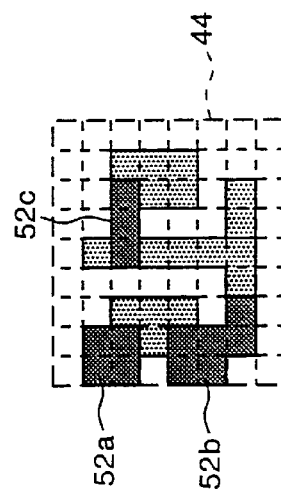

ARRANGEMENT FOR IMPROVING DEFECT SCANNER SENSITIVITY AND SCANNING DEFECTS ON DIE OF A SEMICONDUCTOR WAFER

TECHNICAL FIELD

The present invention relates to scanning for defects on a die formed on a semiconductor wafer, and is specifically directed to methods for adjusting the sensitivity of defect scanning devices, and methods of identifying defects that affect the yield of a die on a wafer during fabrication thereof.

BACKGROUND ART

Semiconductor circuits are manufactured by fabricating a plurality of dies on a single wafer. The dies on the wafer, also referred to as "chips", typically have the same circuit pattern to minimize complexity during wafer fabrication. An important factor in maximizing yield and maintaining quality control during manufacturing is accurate detection of defects on the dies. A defect can be a deformity such as extra or missing material in a layer of a circuit, typically caused by contaminants such as an unwanted particle or droplet of liquid which falls on the wafer during the manufacturing process.

Defect scanners have been developed to provide improved accuracy in identifying the size and location of defects. For example, light scattering defect scanners detect defects on a circuit pattern of a die by directing a beam of light at the circuit pattern at an angle of 45° incident to the wafer surface and perpendicular to the circuit pattern of the die. Any object on the circuit pattern at an angle other than 90° will generate a scattering light pattern and thus be considered a defect. Defect scanners using pattern matching techniques compare a circuit pattern with corresponding circuit patterns of neighboring dies, such that any variations in the detected patterns are considered defects.

The current tolerance for conventional light scattering defect scanners is ±20 micrometers ($\mu$m) in identifying a defect coordinate on a wafer, and the current tolerance for pattern matching defect scanners is ±12 $\mu$m in identifying the defect coordinate on a wafer. However, current fabrication techniques have produced dies having circuit patterns on the order of one micron (1 $\mu$m). Hence, the existing scanners cannot adequately detect defects on dies having 1 $\mu$m circuit patterns because the scanners have insufficient sensitivity, resolution, or accuracy to measure the 1 $\mu$m circuit patterns.

Prior attempts to calibrate the sensitivity of defect scanners have included randomly depositing predetermined sized particles on the wafer. This technique, however, does not improve the accuracy of the scanners relative to each dies because the deposited particles are randomly distributed on the dies. In addition, the depositing of predetermined sized particles on a wafer is a destructive process and cannot be used for defect scanning during wafer fabrication. Finally, the use of particles having the same size precludes the automatic adjustment of the sensitivity of the defect scanning tools.

The defect scanners of the prior art also are unable to distinguish between null defects and killer defects. Null defects do not affect the operation or yield of a circuit pattern, and killer defects render the circuit pattern inoperable, requiring scrapping of the dies. An example of a null defect is a particle falling on a dies during wafer fabrication that lands at a portion of the die that is separate from the circuit pattern. Another example of a null defect is a particle landing on a redundant portion of the circuit pattern or a noncritical portion of the circuit pattern, enabling the continued use of the integrated circuit after the manufacturing of the dies is completed.

Conventional defect detecting techniques involve visual inspection of the dies using a microscope, where a technician visually inspects representative samples of the wafer to identify defects. Such techniques are inefficient because too much technician time is necessary for inspection. such techniques also are inadequate in accurately detecting defects because a technician may misjudge the position of a defect on the circuit pattern. A technician may also erroneously scrap a wafer due to a large defect that is not a killer defect, but rather a null defect. The technician also cannot anticipate the effect of a defect on subsequent layers during the fabrication process.

Finally, visual inspection does not provide a reliable collection of data for failure analysis. Hence, quality control efforts are hindered because there is no accurate arrangement for identifying critical areas of the circuit pattern having a high failure rate due to an unusually high sensitivity to defects.

DISCLOSURE OF THE INVENTION

There is a need for an arrangement that improves the accuracy of a defect scanner without adding additional steps to the fabrication process.

There is also a need for an arrangement that measures the sensitivity of a scanner without adding additional steps to the fabrication process.

There is also a need for calibrating coordinate data from a defect scanner with a specific dies on a wafer.

There is also a need for improving the effective resolution and sensitivity of a defect scanner by aligning the defect scanner to a selected die.

There is also a need for a real time defect scanning system that determines the effect of detected defects on a circuit pattern of a die.

There is also a need for predicting the effect of detected defects with respect to subsequent circuit pattern layers on the die.

There is also a need for an arrangement that accurately estimates the predicted yield of a die based on prior defect scans. More specifically, there is a need for predicting critical areas of a circuit pattern that are particularly sensitive to defects.

These and other needs are attained by the present invention, whereby defects on a die are accurately detected and analyzed to determine the effect of the detected defects on the integrated circuit formed by the circuit layers of the die.

According to one aspect of the present invention, a die includes a substrate, a circuit pattern formed on the substrate, and a mark formed on the die and having a predetermined position relative to the circuit pattern and a predetermined size corresponding to a sensitivity of a defect scanner. Scanning of the die is improved by enabling a defect scanner to be calibrated in response to detection of the mark on the die. Detection of the mark by the defect scanner provides calibration of defect scan data by mapping the defect scan data based on the predetermined position of the mark relative to the circuit pattern. Hence, the effective resolution of the defect scanner with respect to the scanned die is substantially improved.

According to another aspect of the present invention, a method of scanning defects on a wafer having a plurality of dies includes the steps of forming on the wafer for each die a circuit pattern and a mark having a predetermined size and position relative to the corresponding circuit pattern, calibrating a defect scanner to one of the dies by scanning at least the corresponding mark, and scanning for defects on the circuit pattern of the one die using the calibrated defect scanner. Forming the circuit pattern and the mark on the wafer enables the use of precise masking techniques to position the mark, also referred to as a preset defect, at a specific location relative to the circuit pattern to enable accurate calibration of the defect scanner. In addition, the addition of the mark during the masking process enables the scanner accuracy and sensitivity to be measured without adding additional steps to the fabrication process.

The size of the mark formed on the die can also be controlled, enabling the sensitivity of the scanner to be determined by distinguishing the detected mark from the signal noise level and the defect scanner, and the mark can be used for calibrating light scattering defect scanners and pattern matching defect scanners during the same scanning operation. Hence, the method of the present invention improves scanner accuracy from a 10 $\mu$m resolution in identifying a defect coordinate on a wafer to a 1 $\mu$m resolution in identifying a defect coordinate on a selected die. Hence, the accuracy and precision of existing defect scanners can be improved for 1 micron technology.

In another aspect of the present invention, a method of scanning defects on a wafer having a plurality of dies includes the steps of converting a circuit pattern layout representing a circuit pattern of at least one of the die to a layout look-up table comprising pixel representations of selected portions of the circuit pattern and at least one adjacent circuit layer of the one die, scanning the one die for defects using a defect scanner, overlapping defect information corresponding to the scanned defects with the layout look-up table, summing layout overlap areas from each layer of the layout look-up table for each of the scanned defects, and identifying killer defects as the scanned defects having summed layout areas exceeding a predetermined threshold. The use of a layout look-up table with defect information enables real-time evaluation of scanned defects that fall on a circuit pattern on the die. Overlapping the defect information corresponding to the scanned defects with the layout look-up table provides real-time information regarding the effect of the scanned defects, for example, whether the scanned defect is a killer defect that causes a catastrophic effect on the circuit, or a null defect that does not effect the circuit operation. Moreover, the use of a layout look-up table that includes pixel representations of adjacent circuit layers enables a technician to anticipate the effect of a scanned defect to future circuit layers overlying the existing circuit pattern on the die. Thus, a technician can distinguish killer defects from null defects on existing circuit patterns and subsequent circuit pattern layers.

The method of scanning defects further includes sorting the scanned defects by the corresponding summed layout overlap area, classifying the sorted defects into identified defect classes, for each of the defect classes resampling the classified defects by overlapping the defect information corresponding to the classified defects with a layout look-up table corresponding to each defect class, for each classified defect summing the layout overlap area of the corresponding defect information from each layer of the layout look-up table corresponding to each defect class, identifying a classified defect as a potential killer defect if the corresponding summed layout overlap area exceeds a predetermined threshold for the corresponding defect class, and identifying the die as defected if the number of identified potential killer defects exceeds a predetermined threshold corresponding to the die. Thus, the method provides two levels of detecting defects, the first identifying killer defects in real-time to provide a fast throughput for use on a production line; and the second providing more detailed analysis by identifying potential killer defects and identifying if the number of potential killer defects is above a predetermined threshold. Thus, the method provides a more thorough analysis of potential defects, and provides a more accurate estimation of the predicted yield of the wafer. By storing the defect information in a database, a method also enables more accurate prediction of production yields, and enables identification of critical areas of the circuit pattern that have a high incidence of killer defects.

Still another aspect of the present invention provides a system for detecting defects in a die on a wafer, comprising a system for detecting defects in a die on a wafer, comprising a layout storage device storing circuit patterns of each layer of the die, a look-up table processing system generating at least one layout look-up table for one of the layers of the die, the layout look-up table comprising a pixel representation of a selected portion of the circuit pattern of the one layer and a selected portion of the circuit pattern of at least an adjacent layer, a defect filtering system determining killer defects by comparing scanned defect data with the at least one layout look-up table and a determined threshold, a scanner scanning the defects on the die and outputting defect scan data, and a database system storing the defect scan data and relationships of the defect scan data including defect classes, defect location relative to the circuit patterns, and determined killer defects, the defect filtering system determining the threshold based on the stored defect scan data and the stored relationships. The look-up table processing system enables real-time analysis of detected defects at selected portions of the circuit pattern representing critical or sensitive portions of the circuit pattern. Moreover, different look-up tables can be used for different classes of defects, enabling the use of layout look-up tables for different critical components, depending on the type of defect that is detected. The defect filtering system thus determines killer defects by comparing scanned defect data with selected layout look-up tables that identify different circuit patterns having different sensitivities to various classes of defects. By storing the defects and defect classes in a database system, the defect filtering system is able to identify portions of the circuit pattern that have high incidence of killer defects, and can predict yields in die having specific circuit patterns sensitive to defects.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF DRAWINGS

Reference is made to the attached drawings, wherein elements having the same reference numeral designations represent like elements throughout and wherein:

FIG. 4 is a block diagram of a system for detecting defects on a die of a wafer according to an embodiment of the present invention.

FIG. 5 is a diagram illustrating the steps of converting a circuit pattern layout to a layout look-up table.

FIGS. 6A, 6B and 6C are diagrams illustrating layout overlap areas formed by overlapping defect information with a layout look-up table.

BEST MODE FOR CARRYING OUT THE INVENTION

The present invention provides accurate detection of defects on a die and accurate estimation of the effect of the detected defects on circuit patterns of the die. The precision and accuracy of defect scanners are improved by calibrating the defect scanners to a mark formed on the die. The mark has a predetermined position relative to the circuit pattern on the die. Defect scanners specified by an accuracy range relative to an entire wafer have improved accuracy by scanning at least the mark corresponding to a die. For example, a scanner that has a 10 μm resolution for measuring defect coordinates on a wafer may be calibrated to an accuracy of, e.g., 1 μm for measuring errors on a corresponding die.

Figure 1A:
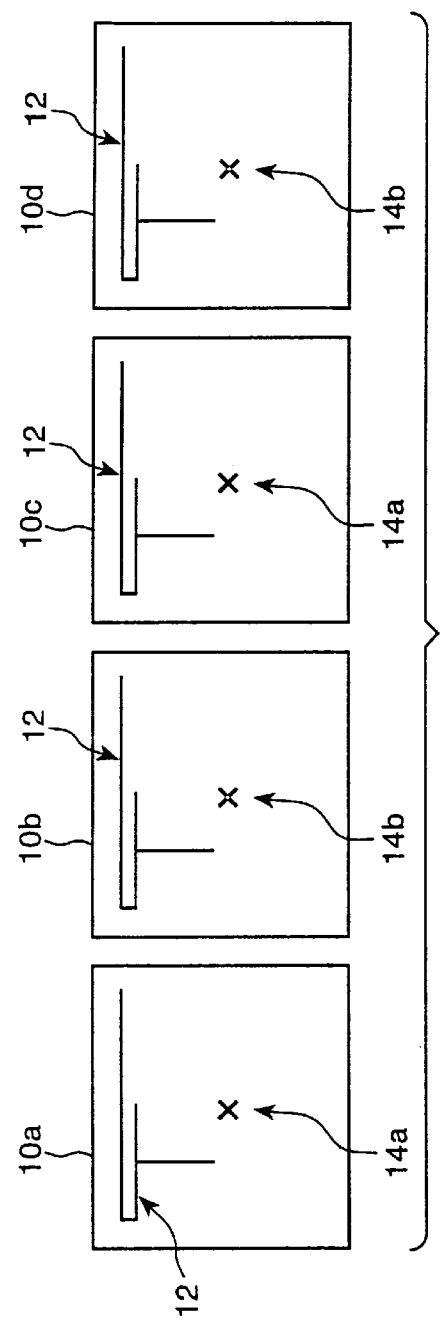
FIGS. 1A, 1B and 1C are diagrams illustrating preset defects for use on a die of a wafer according to an embodiment of the present invention.
Figure 1B:
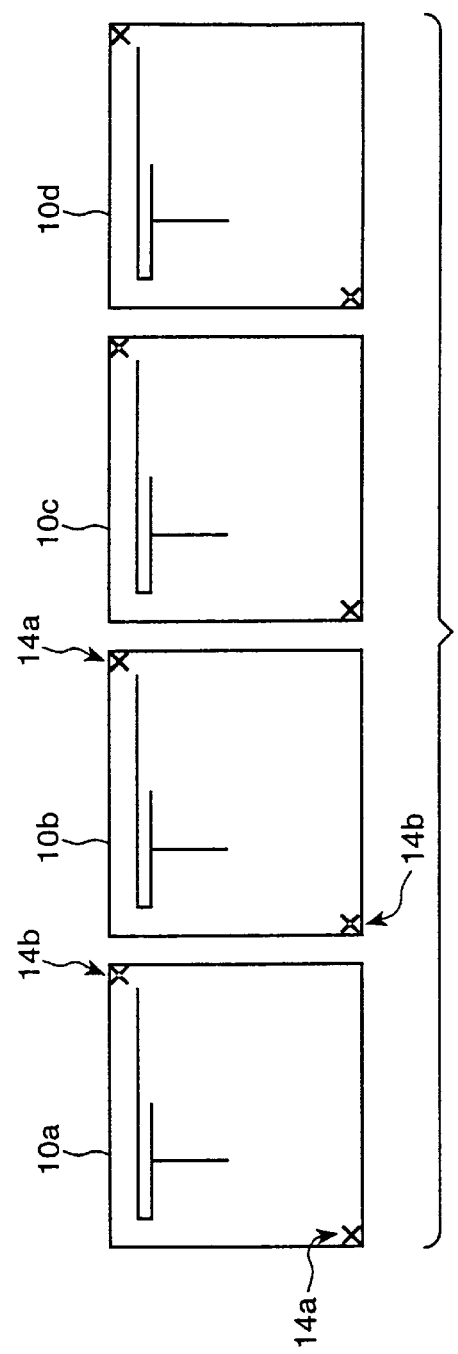

FIGS. 1A and 1B are diagrams illustrating a plurality of dies 10 on a wafer having preset defects 14, also referred to as marks, that enable intradies alignment of a scanner. Each die 10 has a circuit pattern 12 and a mark 14 having a predetermined size and position relative to the circuit pattern 12. The marks 14 are part of the mask pattern used during wafer fabrication to form the circuit pattern 12, hence no extra physical step is needed to add the marks 14. Different marks 14 may be added during each masking step of the wafer fabrication process to perform defect scanning after each masking step. If desired, the marks 14 may be selectively etched during subsequent masking operations after the desired defect scanning process for the current mask layer is completed.

Figure 1C:
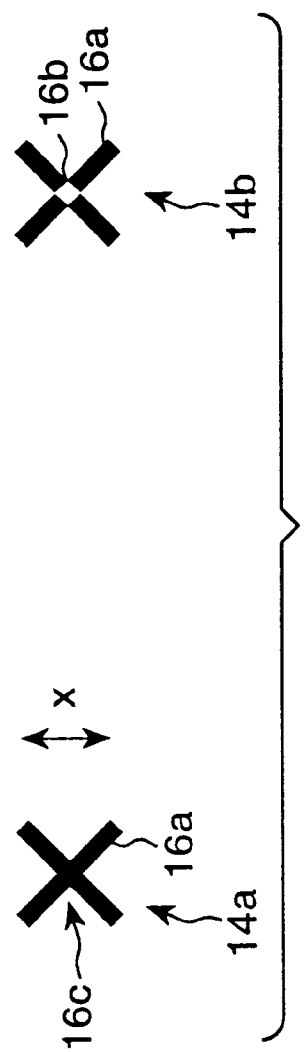

FIG. 1C shows in detail the present defects 14a and 14b. The marks 14a and 14b have a cross pattern 16a, and the mark 14b has an empty portion 16b whereas the mark 14a has a filled mid portion 16c. The overall size (x) of the marks 14a and 14b corresponds to the sensitivity of a light scattering defect scanner, such as an Inspex defect scanner. The tolerance for the Inspex light scattering defect scanner is specified at ±20 μm in identifying defect coordinates on a wafer, and the tolerance for a pattern matching defect scanner, for example a KLA scanner, is specified at ±12 μm in identifying defect coordinates on a wafer. However, the usual error observed during actual testing is in the range of 5–10 μm.

The sensitivity of the devices can be determined by providing a plurality of marks of different sizes. Thus, the sensitivity of a defect scanner can be determined by determining the minimum size preset defect 14 detected by the scanner. The minimum mark size (x) for the light scattering defect scanner should be approximately 2–3 μm, and the minimum size of the mid points 16c and 16b for a pattern matching defect scanner should be a minimum on the order of 1 μm.

FIG. 1A illustrates one arrangement of marks 14 on the die 10, where die 10a and 10c have marks 14a with filled mid points 16c positioned in the center of the die 10 relative to the circuit pattern 12. The die 10b and 10d have marks 14b including empty mid points 16b positioned in the same relative location as the marks 14a. Hence, the marks 14a and 14b provide complementary patterns between adjacent die 10a and 10b that enable a pattern matching defect scanner to identify the marks 14 as defects due to variations in the detected patterns.

The marks 14a and 14b are detected by light scattering defect scanners by directing light perpendicular to the circuit pattern on the die of the wafer and at an incident angle of 45°, i.e. relative to the surface of the die. As recognized in the art, the pattern 12 positioned at 90° angles will not generate any scattering. The mark 14 positioned at a 45° angle relative to the pattern 12 and the directed light will generate scattering light, which will be recognized by the defect scanner as a defect. The processing of the defects, described below, will identify the detected defect at the preset mark on the die.

Figure 2:
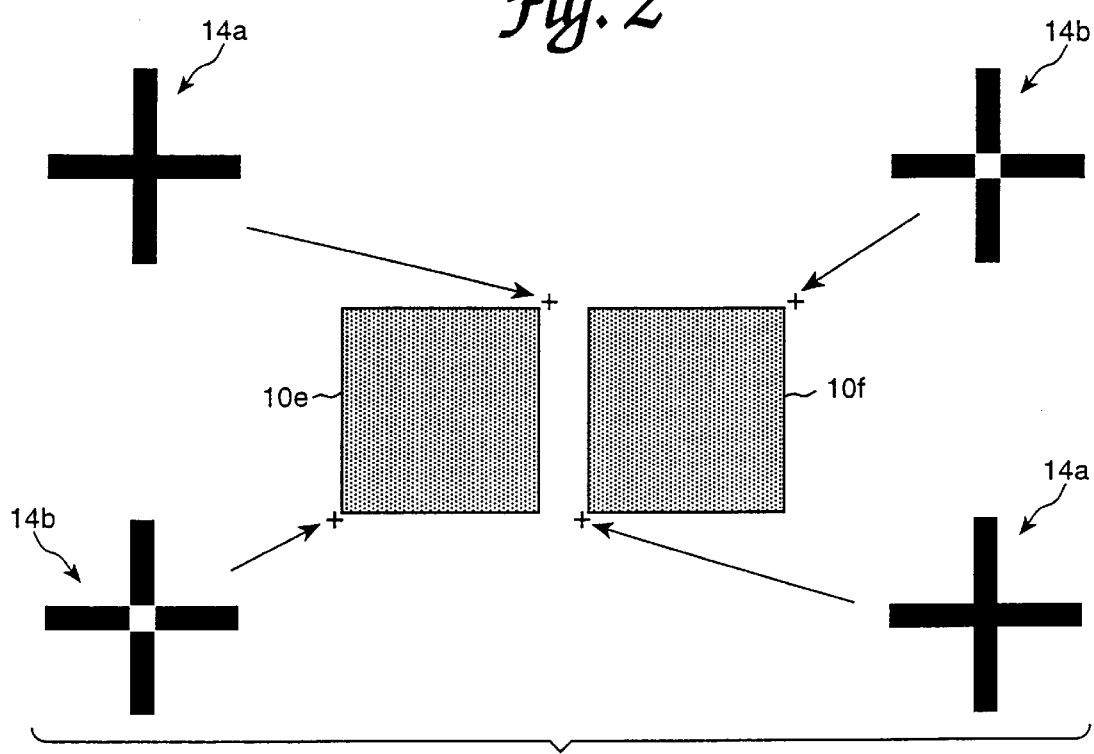
FIG. 2 is a diagram illustrating a mark pattern for preset defect local alignment using a nearby die comparison.

Hence, use of the marks 14a and 14b on alternating die 10a and 10b respectively enables the marks to be detected by both light scattering defect scanners and pattern matching defect scanners. The position of the marks 14a and 14b may be positioned at the center of the die 10, shown in FIG. 1A, or alternatively positioned at respective corners of the die, shown in FIG. 1B. The arrangement of FIG. 1B, also referred to as a nearby-die-comparison scheme, is shown in more detail in FIG. 2. The die 10e and 10f in FIG. 2 have marks 14 with complementary patterns including the cross patterns and filled and empty mid points, respectively. Once the defect scanners detect the preset defect 14 of a corresponding die, the defect scanner can be calibrated to the specific die.

Figure 3:
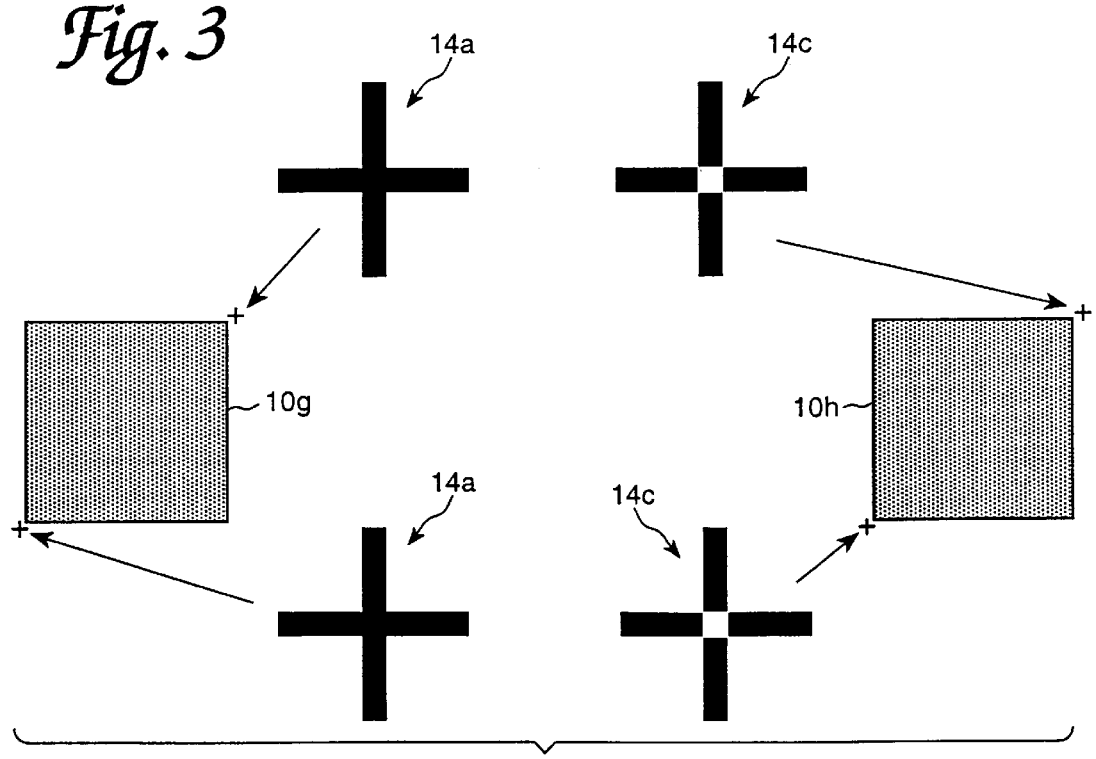
FIG. 3 is a diagram illustrating mark patterns for preset defect local alignment using a perfect pattern comparison.

FIG. 3 illustrates a perfect pattern comparison scheme, where the die 10g includes marks 14a positioned relative to the circuit pattern on the die 10g. A layout of the mask layer used to form the die 10g is stored in a memory (not shown), and the filled mid points of the marks 14a in the stored layout are replaced with marks 14c having empty mid points. The modified layout 10h is then stored in memory. This arrangement is particularly advantageous for die having repeating patterns, such as memory devices.

Hence, a precise intradie alignment provides improved accuracy and resolution for defect scanners. Since the marks 14 are formed during the masking process, precise masking techniques such as photolithography may be used to precisely position the mark 14 relative to the circuit 12.

FIG. 4 is a block diagram of a layout mapping defect filtering system 15 according to an embodiment of the present invention. The layout mapping defect filtering system 15 collects defect scan data and determines the interaction between the detected defects and the circuit layout. For example, layout mapping defect filtering system 15 provides automatic identification in real time of killer defects that cause failure of the completed integrated circuit. The layout mapping filtering system 15 also classifies defects and analyzes the classified defects to identify potential killer defects within specified defect classes. If the number of potential killer defects within the scanned die exceeds a predetermined threshold corresponding to the die, the die is identified as defective, having an unacceptably high number of potential killer defects. If the number of defective dies on a wafer exceeds a predetermined number corresponding to the wafer, the wafer is scrapped.

Hence, the layout mapping defect filtering system 15 provides real time evaluation of scanned defects to distinguish killer defects and potential killer defects from null defects that have no adverse effect on the completed integrated circuit on the die after fabrication. Moreover, the layout mapping defect filtering system enables an accumulation of defect-layout interaction data during wafer fabrication. Thus, valuable information can be obtained to identify critical areas of circuit patterns that have an unacceptably high failure rate during fabrication. Such data may also be used to improve the yield of the dies by redesigning the circuit patterns to eliminate the critical areas having high failure rates due to unusually high sensitivity to defects.

The layout mapping defect filtering system includes a layout storage device 20 that stores circuit pattern layouts for each layer of the die 10 to be manufactured. The circuit pattern layouts define the mask patterns used to form the circuit patterns 12 on the die, and are stored in the layout storage device 20 according to the industry-standard GDS II format.

The circuit patterns stored in the layout storage device 20 in GDS II format are converted by a look-up table processing system 22 into a look-up table having pixel representations of selected portions of two or more circuit layer. Specifically, the look-up table processing system 22 converts selected portions of the circuit pattern of a layer of the die from GDS II format into a layout look-up table. The converted layout look-up table enables real time processing of the defect data to determine the interaction between the detected defect and the circuit patterns.

The layout mapping defect filtering system 15 also includes a defect filtering system 24 that generates filtered defect maps for identifying selected defects, described below. The defect filtering system 24 determines the effect of defects on circuit patterns by comparing scanned defect data with a selected layout look-up table from the look-up table processing system 22 and by comparing the scanned defect data and the accessed layout look-up table with identified relationships supplied from a defect management system (DMS) database 28.

The system 15 also includes a defect scanner 26 that scans the defects on the die and outputs the defect scan data to the DMS database 28. The DMS database 28 stores the defect scan data and relationships of the defect scan data including defect classes, defect location relative to the circuit pattern, and determined killer defects. The DMS database 28 also supplies the defect scan data and relationships of the defect scan data to the defect filtering system 24 for comparison of the defect scan data and associated relationships with a selected layout look-up table from the look-up table processing system 22.

The DMS database 28 is, in the preferred embodiment, an Oracle-based database that stores information associated with the defect scan data output from the defect scanner 26. The DMS database 28 has two objects. The first object is the "loader" that converts the scan data received from the defect scanner 26 from the scanner format into the standard database format used by the Oracle-type DMS database 28. The second object of the DMS database 28 is "local database", which includes the standard-format data loaded by the loader object. As will be recognized in the art, the DMS database 28 stores the defect scan data and relationship of the defect scan data including defect classes, defect location relative to the circuit patterns, and determined killer defects. The loader interacts with the defect scanner 28 to load the defect scan data into the DMS database 28 in real time.

As described below, the defect filtering system 24 retrieves the defect data including defect coordinate from the DMS database, performs auto-alignment and intradie alignment using the detected preset defects, and then combines the aligned defect coordinates with a selected layout look-up table to determine what percentage of the defects overlap the layout.

The layout mapping defect filtering system also includes an automatic defect classification 30, associated with the DMS database 28 and the defect filtering system 24, for classifying defects based on selected classes, for example, geometric shape, to enable identification of the type of defect that has been detected. Use of the automatic defect classification 30 provides a more accurate evaluation in determining potential killer defect in determining whether the potential killer defect reduce the yield of the die.

FIG. 5 illustrates the steps for converting the circuit pattern layouts stored in the layout storage device 20 from GDS II format into a layout look-up table for real time analysis of the scanner defect data. The circuit patterns stored in the layout storage device 20 are converted into a layout look-up table before actual scanning of wafers during fabrication. Layout look-up tables determine the degree of membership of a scanned defect to a specific characteristic. For example, a scanned defect may be analyzed to determine whether it belongs to a certain defect class; alternatively, the scanned defect may be analyzed to determine whether it can be considered a killer defect on the basis of its size, or whether the defect has a particular composition based upon the state of the masking process.

Hence, a layout look-up table is generated for each product (i.e., each die having a different pattern), for each defect scanning step, and for each class of defect. Consequently, sampling of defect data for a specific analysis may use a different layout look-up table to identify specific characteristics of the defect data being sample. Each sampling analysis, also referred to as a "review purpose" may have a separate layout look-up table (LLUT) in order to provide real time analysis of these defect data.

As shown in FIG. 5, an initial mask layout 32 in GDS II format includes a circuit pattern 34. The circuit pattern 34 is expanded to a size corresponding to the sensitivity of a calibrated defect scanner. According to the disclosed embodiment, the pattern in the layout is expanded in image 36 to 1 μm to match the resolution of the pattern matching defect scanner after automatic intradie alignment using the preset defects discussed above. A pixel matrix 40 is then generated by matching the expanded layout 36 with a grid 42 of 1 μm spacing. Each grid pixel represents a square having dimensions of 1 μm×1 μm. Each grid pixel which is partially or fully overlapped with the expanded circuit pattern 38 will be considered as full, resulting in the pixel representation 38' of the expanded circuit pattern 38. The pixel matrix 40 is then compressed so that each pixel is represented by one bit. The compressed pixel matrix of each layer 40 contains a header of X, Y dimension in the compressed matrix including the value of each grid pixel.

After formation of a compressed pixel matrix representing a layer of the circuit pattern, selected portions of the circuit pattern layer are combined with selected portions of circuit patterns in adjacent layers that will be affected by a detected defect in a particular scanning step. For example, a detected defect such as an embedded particle may interact with the circuit layer formed during the last fabrication step and the adjacent circuit layer below the newly-formed circuit layer to form either a killer defect or a potential killer defect between the two layers. Alternately, a detected defect such as a surface defect may interact with the newly-formed circuit layer and a subsequent adjacent circuit pattern layer overlying the newly-formed layer to form either a killer defect or a potential killer defect between the two layers. Hence, the layout look-up table enables anticipation of the interaction of a scanned defect between an existing circuit layer and adjacent circuit pattern layers.

As shown in FIG. 5, the compressed pixel matrix for the one circuit pattern layer 40 is combined with adjacent upper and lower circuit pattern layers to determine the interaction of a scanned defect on the adjacent layers. For example, the pixel circuit pattern 46 represent a circuit portion of the adjacent lower layer, and the pixel circuit patterns 48 and 50 represent the portions of the adjacent upper layer relative to the pixel circuit pattern 38'.

After conversion of the circuit layout from the GDS II format stored in the layout storage device 20 to the layout look-up table 44, the layout look-up table having pixel representations of selected portions of the circuit pattern from adjacent layers is stored in the look-up table processing system 22.

The layout conversion procedure is repeated for each scanning step to be performed after each masking step during the wafer fabrication process. The resulting files for the corresponding layers will then be combined to form the layout look-up table 44 for the scanning step. The layout conversion procedure is also repeated for each class of defect, and for each product. Hence, different look-up tables may be generated for different classes of defects, including embedded particles, surface particles, or particles classified by geometric shape.

Figure 7:
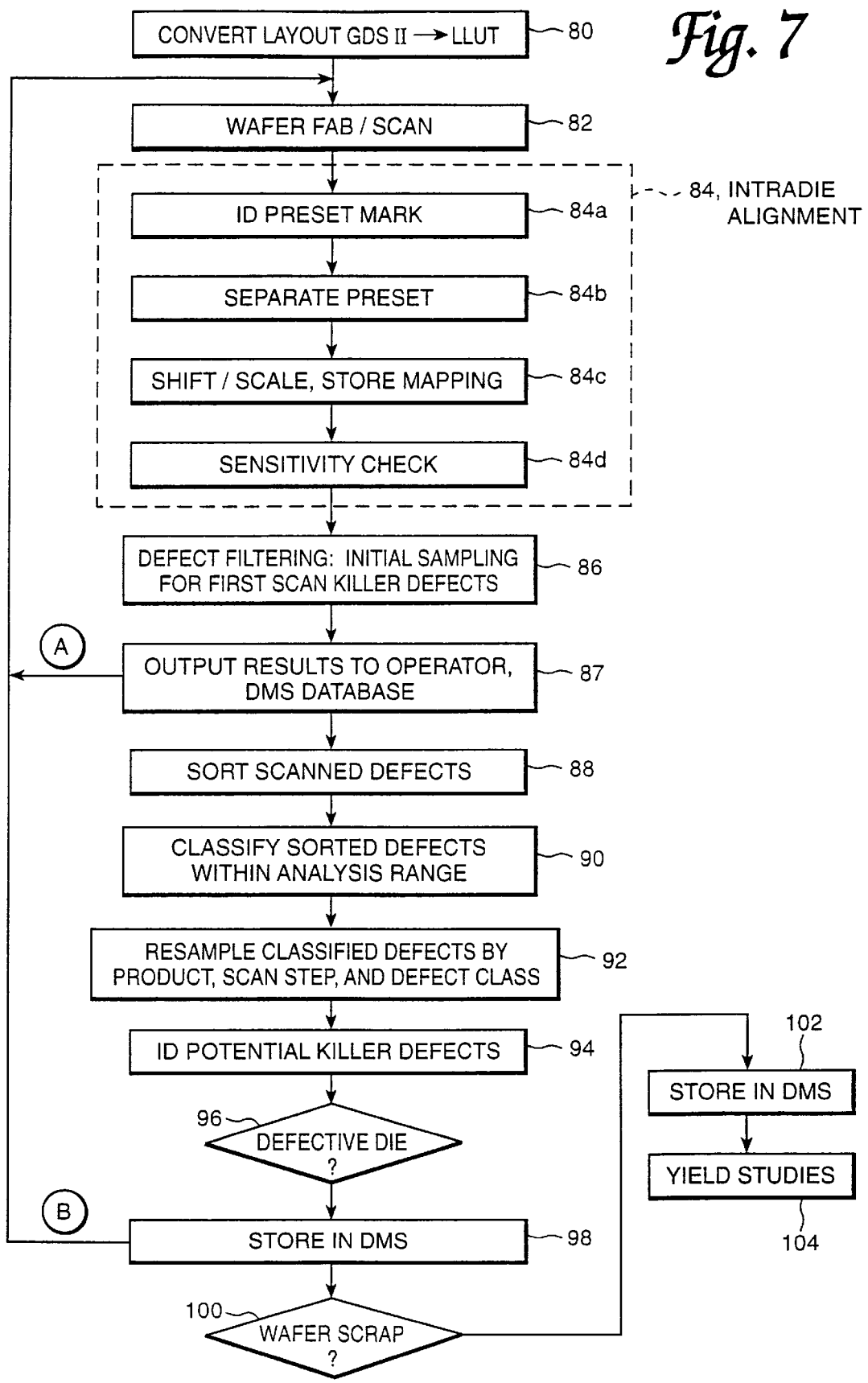
FIG. 7 is a flow diagram of the method of scanning defects on a die of a wafer according to an embodiment of the present invention.

FIG. 7 is a flow diagram of the preferred method of scanning defects on a wafer having a plurality of dies according to the embodiment of the present invention. The process begins in step 80 by converting the circuit pattern layout from GDS II format to the layout look-up table 44 shown in FIG. 5. The layout look-up table includes pixel representations of selected portions of the circuit pattern and at least one adjacent circuit layer of the die to be scanned. As discussed above, the layout conversion in step 80 is preferably performed before the manufacturing process so that the layout look-up tables are available for real time processing.

After the layout look-up tables have been generated and stored in the look-up table processing system 22, the wafer fabrication and die scanning process begins in step 82, whereby the die 10 is scanned after a wafer fabrication step. During scanning by the defect scanner 26, the scan data is accessed by the loader object in the DMS database 28, converted into standardized database format, and stored in the local database object of the DMS database 28. The scan data includes the coordinate information for the wafer and the coordinate information for each of the scanned defects, including the preset mark 14 identifying the preset defect.

The defect filtering system 24 then accesses the defect data from the DMS database 28 in step 84 to perform the preset defect and intradie alignment. The substeps of step 84 include recognizing the mark 14 from the scan data in step 84a, for example, by correlating the location of the defect with the wafer coordinate. The preset defects are known to be at predetermined locations, for example, at the center or identified corners of the die 10, hence the detected defects at a given location and having a specified shape will be identified as the preset defect. Once the preset defect is identified by the mark 14, the preset defect is separated from the other defect information in step 84b before processing the actual defect data. The scanner is calibrated with the die 10 being scanned by shifting and scaling the coordinate information of the wafer coordinates with the coordinate of the scanned mark 14, and storing the mapping coordinates in step 84c. Thus, the relationship between the determined wafer coordinate and the determined scanned mark coordinate are stored as a mapping table to automatically translate the coordinates of the scanned defect data to aligned defect coordinates for the die being scanned.

Finally, the signal to noise ratio between the detected preset defect and the noise signal level of the defect scanner is checked in step 84d to determine the sensitivity of the defect scanner.

After the defect scan data has been aligned with the scanned die using the preset defect, defect filtering is performed in step 86 by executing an initial sampling of the scanned defects on the die to determine the existence of a first scan killer defect, described below. The results of the initial sampling of defect filtering are provided in real time to an operator and stored in the DMS database 28 in step 87. Providing the results in real time to an operator, for example a production line engineer or technician monitoring the wafer fabrication, enables determination whether a first scan killer defect (e.g. a catastrophic defect) is present in the die. If no first scan killer defect is detected in step 86, a production line will conclude that fabrication can continue, and will return to step 82 via path A in FIG. 7 to scan the next die on the wafer. After all the die on the wafer have been scanned, the next wafer fabrication step will be performed to add the next circuit pattern layer. Hence, the sampling of first scan killer defects is optimized for providing real time analysis of die during wafer fabrication.

Additional defect information can be obtained by determining the presence of potential killer defects in the scanned die. The most accurate determination of the failure rate of a die, also referred to as "killer ratio", is based on a comparison of the the detected first scan killer defects and potential killer defects with accumulated data from the DMS database 28 that provide a statistical estimation of the yield of a die. The accumulated data from the DMS database 28 provides information from prior scans on the interaction of defects on identified circuit patterns as a function of product type (i.e., the die being manufactured), circuit layer under analysis, circuit location or area, and defect characteristics. Defect characteristics are identified as defect classes including composition, size and shape. Hence, the DMS database 28 provides all data related to the interaction of defects with the circuit patterns on the die.

The determination of potential killer defects begins in step 88 by prioritizing the scanned defects by sorting the defects and storing the sorted results in the DMS database 28 in step 88. The defects are sorted by the corresponding summed layout overlap area calculated during the initial sampling of defect filtering in step 86, described below. The sorted defects within a predetermined range of analysis, i.e. below the first scan killer defect threshold and above a minimal potential defect threshold, are then classified in step 90 into identified defect classes, for example, embedded particle, surface particle, etc., or classes characterized by particle composition or geometric shape.

The classified defects for the die are then resampled in step 92 for each product, scanning step and defect class. Thus, for a given scan, the die will be resampled using a layout look-up table identified for each defect class. After resampling, potential killer defects are identified in step 94, and if in step 96 the number of potential killer defect on the scanned die is greater than a predetermined number corresponding to the die the die is considered defective. The results of the classification and resampling are then stored in the database in step 98.

Although the disclosed method is directed to identifying killer defects in step 87 during wafer fabrication, the identification of potential killer defects in steps 88 to 98 may also be performed, for example during production test runs or engineering evaluation of manufacturing processes. In such instances where throughput is not crucial, the scanning process is repeated for the remaining die on the wafer after completion of the analysis of potential killer defects, shown as path B.

After all the die on the wafer has been scanned, a determination is made whether the wafer should be scrapped in step 100. If the percentage of dies on the wafer declared defective are greater than a predetermined amount corresponding to the wafer, the wafer is scrapped, and the resulting defect information is stored in the DMS database in step 102. As data is collected in the database, yield enhancement studies may be selectively performed in step 104 to identify problematic products or critical areas of circuit that have unusually high defect rates. Thus, the system disclosed system provides effective monitoring of detected defects, and maintains a database for subsequent failure analysis and corrective measures to improve long term yield during manufacturing.

Figure 8A:
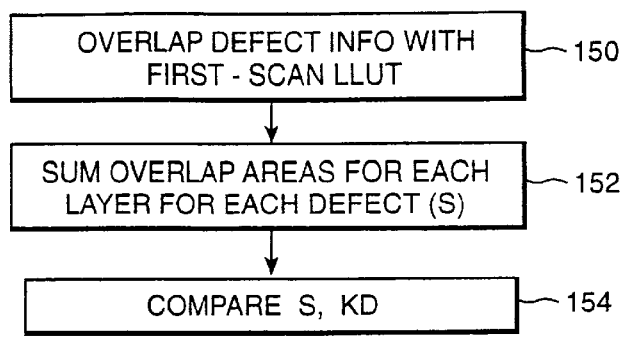
FIGS. 8A and 8B are flow diagrams illustrating the initial sampling and resampling steps of FIG. 7, respectively.

FIG. 8A discloses the steps of defect filtering to identify a first scan killer defect, shown as step 86 of FIG. 7. The initial sampling considers all defects as the same class in an effort to identify severe defects that cause an immediate killer defect. The defect filtering for a first scan killer defect begins in step 150 by overlapping the defect information corresponding to the scanned defects with a layout look-up table selected for the particular purpose of detecting first scan killer defects. The overlapping of defect information with a layout look-up table is illustrated in FIGS. 6A, 6B and FIG. 6C. FIG. 6A illustrates an overlap of the layout look-up table 44 with a first set of defect information 52. FIGS. 6B and 6C illustrate overlapping of second and third sets of defect information 54 and 56, respectively.

The defect information 52 in FIG. 6A is overlapped with the layout look-up table 44 to provide a graphic representation of the interaction between the scanned defects and selected portions of the circuit pattern 44. As described with reference to FIG. 5, the layout look-up table 44 is composed of two or three layers of circuit patterns. The layout overlap area of the corresponding defect information from each layer of the look-up table is summed with the remaining layers of the layout look-up table in step 152 of FIG. 8A to obtain a summed layout overlap area for the defect information within the layout look-up table. For example, assuming in FIG. 6A that the defects 52*a*, 52*b* and 52*c* have pixel overlap values of 4, 6, and 3 respectively, and that each of the defects 52*a*, 52*b* and 52*c* are present on the three layers of the layout look-up table 44, the summed overlap areas for the defects would be 12, 18, and 9, respectively, and the summed overlap for the entire layout look-up table would equal S=3×(4+6+3)=39.

Hence, the overlap area for each defect is summed and the result is be stored in the database in step 152. The three-layer overlap area for each of the defects 52*a*, 52*b* and 52*c* thus provide a value of the interaction of the defect with the layout look-up table. The summed overlap areas of each defect (S) are compared with a killer defect threshold value (KD) in step 154, whereby only defects with a layout overlap area (S) less than the predetermined value (KD) will pass the initial sampling. Thus, if for example the defect 52*b* has a summed overlap area (S=18) exceeding the a predetermined threshold (KD), for example KD=10, the die will be considered defective as having a first scan killer defect. The defect pixels 54 and 56 in FIGS. 6B and 6C, however, do not exceed the predetermined value, assuming each of the pixel are present in each of the three look-up table layers. Hence, since the summed overlap areas of the defect shown in FIGS. 6B and 6C are less than the predetermined threshold, the defects in FIGS. 6B and 6C would not be considered killer defects.

After the initial sampling, the sample defects can then be sorted by priority in step 88 of FIG. 7, in order of the layout overlap area, so that a critical subset of sample defects can be classified by the corresponding summed layout overlap area.

Figure 8B:
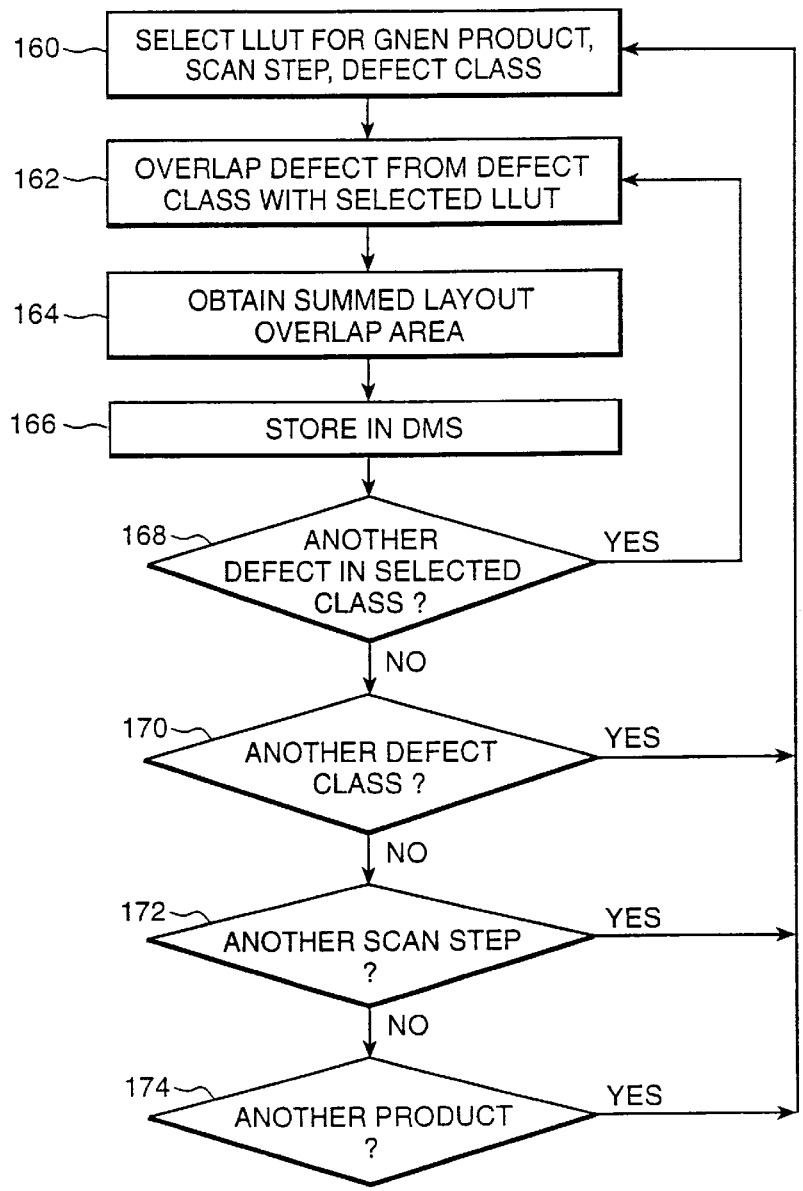

FIG. 8B illustrates the steps of resampling the scanned defects, shown as steps 92 and 94 in FIG. 7. The resampling shown in FIG. 8B is executed as a second filtering operation by the defect filtering system to more precisely identify classes of potential defects. This second filtering is based upon the realization that a killer defect and potential killer defect can be identified if the nature of the defect and its relation to the circuit layout is known.

After the defect classification is completed in step 90 of FIG. 7, the class data is sent to the DMS database 28 and a second filtering will be executed by the defect filtering system 24 in step 160 by selecting a layout look-up table from the look-up table processing system 22 for each class of defect analyzed during the specific scan of the die. For example, if a wafer includes a plurality of identical dies, where each die includes four masking steps, and if there are five identified classes of defects, then there will be at least twenty (20) look-up tables available for the one die to be used for all the scanning steps and all the classes of defects. Hence, there is one layout look-up table accessed for performing a review purpose for each class of defect during each scanning step for each product.

The defect information corresponding to the scanned defect of each defect class is overlapped with the layout look-up table corresponding to the defect class being resampled in step 162. The overlapped defect information and the corresponding layout look-up table for the defect class into consideration is summed as discussed above with respect to FIGS. 6A, 6B and 6C to obtain a summed layout overlap area for the classified defect for the corresponding defect class in step 164. The summed layout overlap area for the defect of the defect class is stored in the DMS database 28 in step 166, and the overlap and summing steps are repeated for each defect of the defect class in step 168. After all scanned defects of the selected class have been sampled by generating summed layout overlap areas, the next class of defects for the given scan is selected in step 170. The sampling process is then repeated for the next scan in step 172, i.e., the next mask circuit layer deposited on the die. The sampling process is then repeated in step 174 for all products, i.e., all die on the wafer.

After the summed layout overlap area has been calculated for the classified defects for the corresponding defect class, the summed layout overlap area for each defect is compared to a predetermined threshold for the corresponding defect class in step 94 of FIG. 7. If the summed layout overlap area of the classified defect exceeds the predetermined threshold for the corresponding defect class, the classified defect is identified as a potential killer defect for the corresponding defect class. All the classified defects for a corresponding defect class are compared to identify the potential killer defects for the corresponding class in step 94.

After the number of potential killer defects for the corresponding defect class has been determined, the number of potential killer defects for the defect class is compared in step 96 to a predetermined threshold corresponding to the die to determine if the die is defective. If the number of potential killer defects exceeds the predetermined threshold corresponding to the die, then the die is considered as defective.

The present invention provides an initial defect filter to provide real time evaluation of first scan killer defects. An additional evaluation is also provided by sorting the scanned defects by the corresponding summed layout overlap area, classifying the sorted defects into identified defect classes, and then performing a second filtering of the classified defects by resampling the classified defects with layout look-up tables corresponding to each defect class to obtain a summed layout overlap area for each classified defect of a corresponding defect class. If the summed layout overlap area exceeds a predetermined threshold for the corresponding defect class, the classified defect is identified as a potential killer defect. Thus, the present invention provides a more accurate approach for identifying killer defects and defective die.

As shown in FIG. 4, the classification process is set up as a feedback process providing filtered feedback data to the defect scanner and the DMS database 28. The feedback process involving the second filtering using classified defects may be omitted if a high throughput is necessary, or if a more simplified system setup is desired. Alternatively, the classification process may implemented partially in the defect scanner 26.

As shown above, the present invention enables more accurate analysis of the interaction of defects with the circuit layout. As the DMS database 28 collects statistical defect information over time, the accuracy in automatically identified killer defects is improved. For example, the thresholds used in identifying the first scan killer defects, potential defects in identified classes of defects, defective die based on an unacceptable number of potential defects, or an unacceptable wafer based on the percentage of defective die, may each be adjusted depending on the statistical evaluation of the interaction of identified defects with portions of the circuit patterns. In addition, the adjustment of the thresholds and identification of different classes enables the sensitivity of defect interaction to be adjusted using the filtered defect map.

Moreover, as information is developed in the DMS database 28, the defect information may be extracted to assist in various yield improvement projects, such as eliminating critical areas from circuits having an unusually high incidence of failures due to a high sensitivity to killer defects. The defect information retrieved from the DMS database may be combined with engineering know-how to improve yield of the die. The layout look-up tables stored in the look-up table processing system may also be modified in response to the data collected in the DMS database 28, based on factors such as critical area, defect classification, layout interaction, yield correlation, etc.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

We claim:

1. A die to be scanned by an optical defect scanner, comprising:
    a substrate;
    a circuit pattern formed on the substrate; and
    an optical alignment mark formed on the die having a predetermined size corresponding to a sensitivity of the optical defect scanner and being at a predetermined position relative to the circuit pattern for calibrating the optical defect scanner to said die.

2. The die of claim 1, wherein the size of the optical alignment mark corresponds to the sensitivity of a light scattering defect scanner.

3. The die of claim 1, wherein a plurality of dies are positioned on a wafer, the optical alignment marks of the respective die having alternating patterns corresponding to the sensitivity of a pattern matching defect scanner.

4. The die of claim 1, wherein the optical alignment mark is formed during a masking step of the circuit pattern.

5. A method of scanning defects on a wafer having a plurality of dies, comprising:
    forming on the wafer for each die a circuit pattern and an optical mark having a predetermined size and position relative to the corresponding circuit pattern;
    calibrating an optical defect scanner to one of the dies by optically scanning at least the corresponding optical mark; and
    scanning for defects on the circuit pattern of the one die using the calibrated optical defect scanner.

6. The method of claim 5, wherein each optical mark has a size corresponding to a sensitivity of a light scattering defect scanner.

7. The method of claim 5, wherein the optical marks of adjacent die have complementary patterns having a size corresponding to a sensitivity of a pattern matching defect scanner.

8. The method of claim 7, wherein the adjacent optical marks include cross patterns, the complementary patterns of the adjacent dies including filled and empty mid points, respectively.

9. The method of claim 5, wherein the optical marks each include cross patterns and filled mid points, the method further comprising:
    storing a layout of the mask layer in a memory;
    replacing the filled mid points of the stored layout with empty mid points; and
    storing the modified layout.

10. The method of claim 9, wherein:
    the calibrating step comprises pattern comparing the optically scanned optical mark with the corresponding mark in the stored modified layout; and
    the scanning step comprises pattern comparing the scanned circuit pattern with the corresponding circuit pattern in the stored modified layout.

11. The method of claim 5, wherein the calibrating step comprises:
    determining a wafer coordinate;
    determining a coordinate of the scanned optical mark; and
    storing a relationship between the determined wafer coordinate and the determined scanned optical mark coordinate.

12. The method of claim 5, wherein the calibrating step comprises determining the sensitivity of the defect scanner by comparing a signal level representing the scanned optical mark with a noise signal level.

13. The method of claim 5, wherein the scanning step comprises:

converting a layout of the circuit pattern to a layout look-up table;

sampling the scanned defects by (1) overlapping defect information corresponding to the scanned defects with the layout look-up table, and (2) for each scanned defect, summing a layout overlap area of the corresponding defect information from each layer of the layout look-up table; and identifying a killer defect if one of the summed layout overlap areas exceeds a first predetermined threshold.

14. The method of claim 13, wherein the layout converting step comprises:

expanding the circuit pattern to a size corresponding to the sensitivity of the calibrated defect scanner;

generating a pixel matrix representing the expanded circuit pattern; and combining selected portions of the pixel matrix with selected pixel matrix portions of adjacent circuit pattern layers to form the layout look-up table.

15. The method of claim 13, further comprising:

sorting the scanned defects by the corresponding summed layout overlap area;

classifying the sorted defects having the summed layout overlap areas less than the first predetermined threshold and above a second predetermined threshold into identified defect classes;

for each of the defect classes, resampling the classified defects by overlapping the defect information corresponding to the scanned defects of said each defect class with a layout look-up table corresponding to said each defect class; and for each said classified defect, summing the layout overlap area of the corresponding defect information from each layer of said layout look-up table corresponding to each defect class.

16. The method of claim 15, further comprising:

identifying a classified defect as a potential killer defect if the corresponding summed layout overlap area exceeds a predetermined threshold for the corresponding defect class; and identifying the one die as defective if the number of identified potential killer defects exceeds a predetermined threshold corresponding to the die.

17. The method of claim 16, further comprising:

storing the scanned defects and the respective summed layout areas in a database; and predicting a yield of a subsequent die in response to the stored scanned defects and subsequent scans of the subsequent die.

18. The method of claim 16, further comprising:

storing the scanned defects and the corresponding summed layout area in a database; and identifying a critical area of the circuit pattern in response to the stored scanned defects and summed layout areas.

19. The method of claim 15, wherein the defect classes include embedded particles and surface particles.

20. The method of claim 15, wherein the defect classes include geometric shaped classes.

21. A method of scanning defects on a wafer having a plurality of dies, comprising:

converting a circuit pattern layout representing a circuit pattern of at least one of the dies to a layout look-up table comprising pixel representations of selected portions of the circuit pattern and at least one adjacent circuit layer of the one die;

scanning the one die for defects using a defect scanner;

overlapping defect information corresponding to the scanned defects with the layout look-up table;

summing layout overlap areas from each layer of the layout look-up table for each of the scanned defects; and identifying killer defects as the scanned defects having summed layout overlap areas exceeding a predetermined threshold.

22. The method of claim 21, further comprising:

detecting a preset defect formed on the one die and positioned relative to the circuit pattern; and generating aligned defect coordinates from scan coordinates of the detected preset defect and the scanned defects.

23. The method of claim 21, further comprising:

storing the defect information and the summed layout overlap areas of the scanned defects in a database; and calculating said predetermined value from stored defect information and summed layout overlap areas of previously-scanned die.

24. The method of claim 21, further comprising:

storing the defect information and the summed layout overlap areas of the scanned defects in a database; and identifying critical areas of the circuit pattern layout from stored defect information and summed layout overlap areas of previously-scanned die having high incidence of the killer defects.

25. The method of claim 21, further comprising:

sorting the scanned defects by the corresponding summed layout overlap area;

classifying the sorted defects having the summed layout overlap areas below the predetermined threshold and above a second predetermined threshold into identified defect classes;

for each of the defect classes, resampling the classified defects by overlapping the defect information corresponding to the classified defects of said each defect class with a layout look-up table corresponding to said each defect class;

for each classified defect, summing the layout overlap area of the corresponding defect information from each layer of said layout look-up table corresponding to each defect class;

identifying a classified defect as a potential killer defect if the corresponding summed layout overlap area exceeds a predetermined threshold for the corresponding defect class; and identifying the one die as defective if the number of identified potential killer defects exceeds a predetermined threshold corresponding to the die.

26. A system for detecting defects in a die on a wafer, comprising:

a layout storage device storing circuit patterns of each layer of the die;

a look-up table processing system generating at least one layout look-up table for one of the layers of the die, the layout look-up table comprising a pixel representation of a selected portion of the circuit pattern of the one layer and a selected portion of the circuit pattern of at least an adjacent layer;

a defect filtering system determining killer defects by comparing scanned defect data with the at least one layout look-up table and a determined threshold;

a scanner scanning the defects on the die and outputting defect scan data; and a database system storing the defect scan data and relationships of the defect scan data including defect classes, defect location relative to the circuit patterns, and determined killer defects, the defect filtering system determining the threshold based on the stored defect scan data and the stored relationships.

27. The system of claim 26, wherein the defect filtering system is operable to identify potential killer defects by comparing the scanned defect data within a selected one of the defect classes with a second layout look-up table corresponding to the selected one defect class and a second threshold corresponding to the selected one defect class.

28. The system of claim 26, further comprising a defect classification system assigning the defects identified by corresponding the defect scan data to at least one of the defect classes and storing the class assignments in the database system as one of the relationships.

* * * * *